United States Patent
Jo et al.

(10) Patent No.: US 8,609,535 B2
(45) Date of Patent: Dec. 17, 2013

(54) SEMICONDUCTOR PACKAGE HAVING THROUGH ELECTRODES THAT REDUCE LEAKAGE CURRENT AND METHOD FOR MANUFACTURING THE SAME

(75) Inventors: Seung Hee Jo, Gyeonggi-do (KR); Sung Cheol Kim, Gyeonggi-do (KR); Sung Min Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 13/286,376

(22) Filed: Nov. 1, 2011

(65) Prior Publication Data

US 2012/0045895 A1  Feb. 23, 2012

Related U.S. Application Data

(62) Division of application No. 12/640,102, filed on Dec. 17, 2009, now abandoned.

(30) Foreign Application Priority Data

Aug. 10, 2009  (KR) ........................ 10-2009-0073506

(51) Int. Cl.
*H01L 21/283* (2006.01)
(52) U.S. Cl.
USPC .... 438/652; 257/621; 257/774; 257/E21.159; 257/E23.174; 438/667; 438/672; 438/675
(58) Field of Classification Search
USPC .......... 257/621, E21.159; 438/652, 667, 672, 438/675, 761, 763, 780
See application file for complete search history.

(56) References Cited

U.S. PATENT DOCUMENTS

| | | | |
|---|---|---|---|
| 6,294,473 B1 | 9/2001 | Oliver | |
| 7,521,807 B2 | 4/2009 | Shizuno | |
| 2003/0080408 A1 | 5/2003 | Farnworth et al. | |
| 2003/0138552 A1 | 7/2003 | Muraoka | |
| 2004/0043615 A1 | 3/2004 | Yamamoto et al. | |
| 2005/0151228 A1 | 7/2005 | Tanida et al. | |
| 2006/0071347 A1* | 4/2006 | Dotta | 257/781 |
| 2008/0054444 A1* | 3/2008 | Tuttle | 257/698 |

(Continued)

FOREIGN PATENT DOCUMENTS

| | | |
|---|---|---|
| JP | 2009-111433 A | 5/2009 |
| KR | 1020060135517 A | 12/2006 |
| KR | 1020090054123 A | 5/2009 |

OTHER PUBLICATIONS

USPTO RR mailed May 9, 2011 in connection with U.S. Appl. No. 12/640,102.

(Continued)

*Primary Examiner* — Peniel M Gumedzoe
(74) *Attorney, Agent, or Firm* — Ladas & Parry LLP

(57) ABSTRACT

A stacked semiconductor package having through electrodes that exhibit a reduced leakage current and a method of making the same are presented. The stacked semiconductor package includes a semiconductor chip, through-holes, and a current leakage prevention layer. The semiconductor chip has opposing first and second surfaces. The through-holes pass entirely through the semiconductor chip and are exposed at the first and second surfaces. A polarized part is formed on at least one of the first and second surfaces of the semiconductor chip. The through-electrodes are disposed within the through-holes. The current leakage prevention layer covers the polarized part and exposes ends of the through-electrodes.

18 Claims, 4 Drawing Sheets

(56) References Cited

U.S. PATENT DOCUMENTS

| | | |
|---|---|---|
| 2008/0265429 A1 | 10/2008 | Kuwajima |
| 2008/0299739 A1 | 12/2008 | Yoshizawa et al. |
| 2010/0061915 A1 | 3/2010 | Hamada |

OTHER PUBLICATIONS

USPTO NFOA mailed Aug. 4, 2011 in connection with U.S. Appl. No. 12/640,102.

* cited by examiner

SEMICONDUCTOR PACKAGE HAVING THROUGH ELECTRODES THAT REDUCE LEAKAGE CURRENT AND METHOD FOR MANUFACTURING THE SAME

CROSS-REFERENCE TO RELATED APPLICATIONS

The present application claims priority to Korean patent application number 10-2009-0073506 filed on Aug. 10, 2009, which is incorporated herein by reference in its entirety.

BACKGROUND OF THE INVENTION

The present invention relates to a semiconductor package and a method for manufacturing the same.

In these modern times, semiconductor chips that are capable of storing and processing huge amounts of data within relatively short periods of times and their corresponding semiconductor packages are in high demand.

Recently, in order to improve the data storage capacities and data processing speeds of a semiconductor package, stacked semiconductor packages, in which at least two semiconductor chips are stacked, have been disclosed in the art.

Conventional stacked semiconductor packages have their semiconductor chips electrically connected by conductive bonding wires. However, in the case where the semiconductor chips are electrically connected by the conductive bonding wires, due to differences in lengths of the conductive bonding wires, problems can arise that make it difficult to process data at a high speeds and at high volumes.

Lately, in order to cope with the problems of the conventional stacked semiconductor package, a technique of electrically connecting semiconductor chips using through-electrodes passing through semiconductor chips has been suggested.

Nevertheless, in the case where the semiconductor chips which are electrically connected using the through-electrodes unwanted current leakages can occur. Also, in order to prevent the occurrence of current leakage, it is necessary to form an insulation pattern through very complicated patterning processes including a deposition process, a photolithographic process, an etching process, a cleaning process, etc.

BRIEF SUMMARY OF THE INVENTION

Embodiments of the present invention are directed to a semiconductor package which can reduce leakage current and significantly decrease the number of processes for realizing the reduction of leakage current, thereby improving the performance of the semiconductor package and reducing the manufacturing cost.

Also, embodiments of the present invention are directed to a method for manufacturing the semiconductor device.

In one embodiment of the present invention, a semiconductor package comprises a semiconductor chip having a first surface, a second surface which faces away from the first surface, through-holes which pass through the first and second surfaces, and a polarized part which is formed on at least one of the first and second surfaces; through-electrodes disposed in the through-holes; and a current leakage prevention layer covering the polarized part and exposing ends of the through-electrodes.

The polarized part may be either polar, i.e., having a hydrophilic part or non-polar, having a hydrophobic part.

The polarized part may be a polar substance containing a hydrophilic group.

The semiconductor package may further comprise connection members disposed on at least ones of both ends of the through-electrodes.

The connection members may contain solder.

The connection members may include a nickel layer and a gold layer on the nickel layer.

The connection members may include a copper layer and a tin-silver layer on the copper layer.

At least two semiconductor chips may be stacked, and through-electrodes of the semiconductor chips may be aligned with each other at the same positions.

The semiconductor package may further comprise an insulation layer interposed between the through-electrodes the semiconductor chip, wherein the current leakage prevention layer covers ends of the insulation layer.

In another embodiment of the present invention, a method for manufacturing a semiconductor package comprises the steps of forming through-electrodes which pass through a first surface and a second surface, facing away from the first surface, of a semiconductor chip; forming first polarized parts onto ends of the through-electrodes that corresponds to at least one of the first surface and the second surface and second polarized parts onto the at least one of the first surface and the second surface excluding the first polarized parts; forming a current leakage prevention layer on the second polarized parts using a current leakage prevention substance that reacts with the second polarized parts; and forming connection members onto at least one ends of the through-electrodes.

Before the step of forming the through-electrodes, the method may further comprise the steps of defining through-holes which pass through the first and second surfaces of the semiconductor chip; and forming an insulation layer on inner surfaces of the semiconductor chip which are formed by defining the through-holes.

In the step of forming the current leakage prevention layer, the current leakage prevention layer may cover exposed ends of the insulation layer.

Before the step of forming the connection members, the method may further comprise the step of removing the first polarized parts from the ends of the through-electrodes.

The step of forming the connection members may comprise the steps of forming a nickel layer on at least one ends of the through-electrodes; and forming a gold layer on the nickel layer.

The step of forming the connection members may comprise the steps of forming a copper layer on at least one ends of the through-electrodes; and forming an alloy layer of tin and silver on the copper layer.

The first polarized parts may either be polar containing a hydrophilic substance or be non-polar containing a hydrophobic substance, and the second polarized parts may either be polar containing a hydrophilic substance or be polar containing a hydrophobic substance.

The second polarized parts may be polar containing a hydrophilic group.

The method may further comprise the step of forming additional first polarized parts on the other ends of the through-electrodes which correspond to the first surface and additional second polarized parts, having a polarity opposite to that of the additional first polarized parts, on the first surface excluding the additional first polarized parts.

DESCRIPTION OF SPECIFIC EMBODIMENTS

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
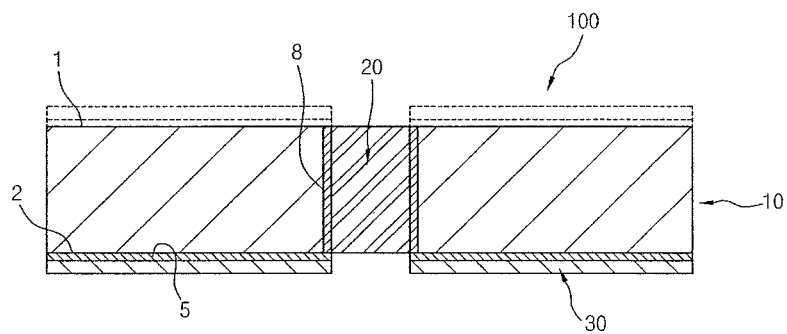
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, a semiconductor package 100 includes a semiconductor chip 10, through-electrodes 20 and a current leakage prevention layer 30.

Of course, semiconductor chips 10 can shaped in any known geometric shape in which a rectangular hexahedral shape of the semiconductor chip 10 will be presented here as an example for illustrative purposes. The semiconductor chip 10 possessing the rectangular hexahedral shape has a first surface 1 and a second surface 2 which faces away from the first surface 1. A circuit section (not shown) having a data storage unit (not shown) for storing data and a data processing unit (not shown) for processing data is disposed in the semiconductor chip 10.

The semiconductor chip 10 further includes a polarized part 5 that which is either polar containing contains a hydrophilic substance or is non-polar containing a hydrophobic substance. The polarized part 5 can be disposed on at least one of the first surface 1 and the second surface 2 of the semiconductor chip 10.

In the embodiment, the polarized part 5 can be polar containing a hydrophilic hydroxyl surface group (—OH).

In the embodiment, for example, the polarized part 5 is formed on the second surface 2 and is polar containing a hydrophilic substance. Unlike this, the polarized part 5 can be formed not only on the second surface 2 but also on the first surface 1, and can be non-polar containing a hydrophobic substance.

The through-electrodes 20 pass through the first surface 1 and the second surface 2 of the semiconductor chip 10. Examples of materials that can be used to form the through-electrodes 20 include copper, aluminum, gold and silver. The through-electrodes 20 may have any 3-dimensional shape such as a square columnar shape, a rectangular columnar shape, a hexagonal columnar shape in which it a cylindrical columnar shape is preferred.

The semiconductor chip 10 can further include an insulation layer 8. The insulation layer 8 is interposed between the through-electrodes 20 and the inner surfaces of the semiconductor chip 10. The insulation layer 8 can comprise an organic layer or an inorganic layer.

The current leakage prevention layer 30 is formed on the polarized part 5 which is formed on at least one of the first surface 1 and the second surface 2 of the semiconductor chip 10. The current leakage prevention layer 30 is preferably not formed where the polarized part 5 is not formed. For example, the current leakage prevention layer 30 is not formed on ends of the through-electrodes 20.

In an embodiment, the current leakage prevention layer 30 can also cover ends of the insulation layer 8 that insulates the through-electrodes 20 and the semiconductor chip 10 from each other so that current leakage is prevented.

Figure 2:
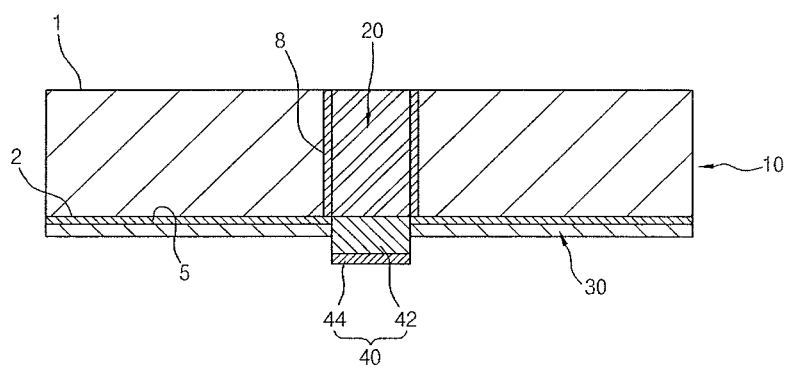
FIG. 2 is a cross-sectional view illustrating a semiconductor package in accordance with another embodiment of the present invention.

FIG. 2 is a cross-sectional view illustrating a semiconductor package in accordance with another embodiment of the present invention. The semiconductor package shown in FIG. 2 has substantially the same construction as the semiconductor package described above with reference to FIG. 1, except connection members. Therefore, description for the same component parts will be omitted herein, and the same technical terms and the same reference numerals will be used to refer to the same or like component parts.

Referring to FIG. 2, a semiconductor package 100 includes a semiconductor chip 10, through-electrodes 20, a current leakage prevention layer 30, and connection members 40.

The connection members 40 function to electrically connect the through-electrodes 20 of respective semiconductor chips 10 when staking at least two semiconductor chips 10.

The connection members 40 can be disposed on at least one ends of both ends of the through-electrodes 20.

Each connection member 40 can, for example, have a single-layered structure and can contain solder.

Meanwhile, each connection member 40 can, for example, have a multi-layered structure and can include a first connection member 42 and a second connection member 44.

In an embodiment, the first connection member 42 can comprise any electroconductive material such as a copper, aluminum, gold, silver and nickel in which it is preferred that the first connection member 42 comprises nickel. The second connection member 44 can also comprise any electroconductive material such as a copper, aluminum, gold, silver and nickel, in which it is preferred that the second connection member 44 comprises a gold. Unlike this, the first connection member 42 can comprise a copper layer, and the second connection member 44 can comprise an alloy layer of tin and silver. In the embodiment, the first and second connection members 42 and 44 of the connection member 40 can comprise plated layers which are respectively formed by plating processes.

In the embodiment, the connection members 40 project from the surface of the current leakage prevention layer 30 by a predetermined height.

Figure 3:
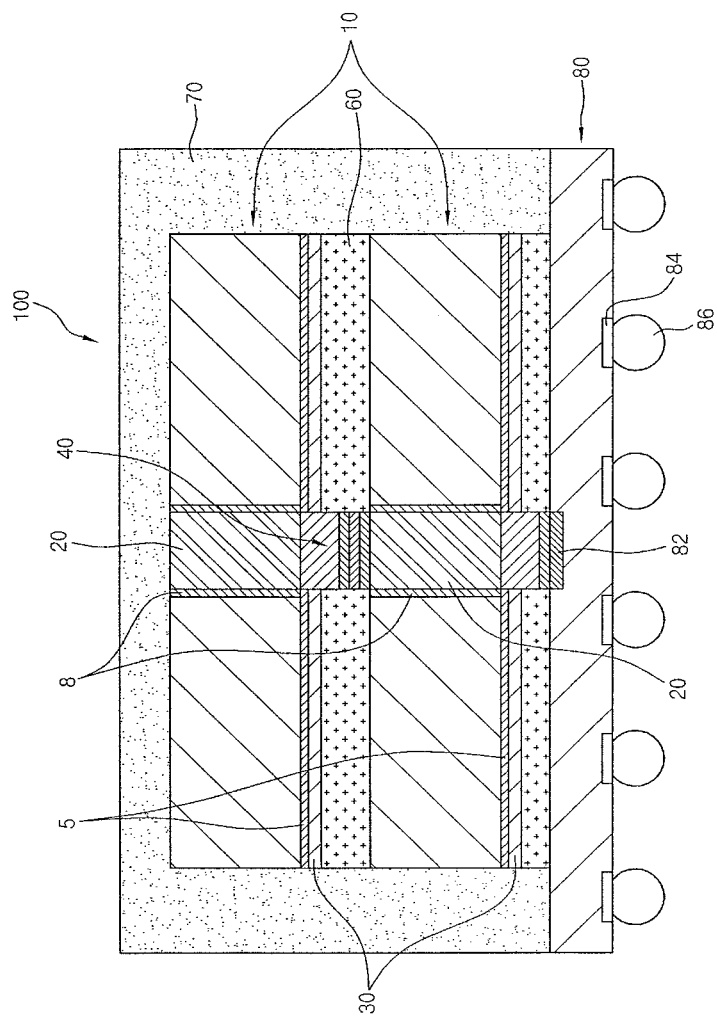
FIG. 3 is a cross-sectional view illustrating a semiconductor package in accordance with another embodiment of the present invention.

FIG. 3 is a cross-sectional view illustrating a semiconductor package in accordance with another embodiment of the present invention. The semiconductor chips, through-electrodes and current leakage prevention layers of the semiconductor package shown in FIG. 3 are constructed in substantially the same manner as in the semiconductor package described above with reference to FIG. 1. Therefore, description for the same component parts will be omitted herein, and the same technical terms and the same reference numerals will be used to refer to the same or like component parts.

Referring to FIG. 3, a semiconductor package 100 includes at least two semiconductor chips 10, through-electrodes 20, current leakage prevention layers 30, connection members 40, gapfill members 60, a molding member 70, and a substrate 80.

As shown, at least two semiconductor chips 10 are stacked. The through-electrodes 20, which pass through the semiconductor chips 10, are aligned with each other so that their respective through-electrodes 20 of the semiconductor chip 10 connected which each other.

The through-electrodes 20 of the stacked semiconductor chips 10 which face each other are electrically connected with each other via the connection members 40. One embodiment of the connection member 40 can include a nickel layer and a gold layer which is placed on the nickel layer. Another embodiment of the connection member 40 can include a copper layer and an alloy layer of tin and silver which is placed on the copper layer. Yet another embodiment of the connection member 40 is that it can contain solder.

In the illustrative embodiment, a connection member 40 composed of a nickel layer and a gold layer is disposed on the lower end of each through-electrode 20 of the upwardly placed semiconductor chip 10, and a connection member 40 composed of a copper layer and an alloy layer of tin and silver is disposed on the upper end of each through-electrode 20 of the downwardly placed semiconductor chip 10. The connection members 40 are electrically and physically connected together to each other.

Of course, the substrate 80 has any known geometric shape in which a plate shape for the substrate 80 will be discussed herein. Connection pads 82 are disposed on the upper surface of the substrate 80, and ball lands 84, which are electrically connected to the connection pads 82, are disposed on the lower surface of the substrate 80 which faces away from the upper surface. Conductive balls 86 are disposed and electrically connected onto the ball lands 84.

The connection members 40 of the downwardly placed semiconductor chip 10 are disposed on the connection pads 82 of the substrate 80.

The gapfill members 60 are filled between the upper and lower semiconductor chips 10 and between the lower semiconductor chip 10 and the substrate 80.

The molding member 70 encloses the semiconductor chips 10 and protects the semiconductor chips 10 from externally applied shocks and vibrations.

FIGS. 4 through 7 are cross-sectional views illustrating a method for manufacturing a semiconductor package in accordance with another embodiment of the present invention.

Figure 4:
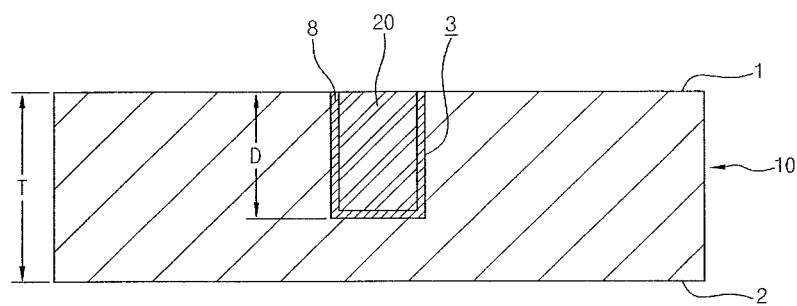
FIGS. 4 through 7 are cross-sectional views illustrating a method for manufacturing a semiconductor package in accordance with another embodiment of the present invention.

Referring to FIG. 4, in order to manufacture a semiconductor package, a semiconductor chip 10, which is formed with a circuit section having a data storage section (not shown) and a data processing unit (not shown), is first manufactured. Then, blind vias 3 are defined that extend downward from an upper surface 1 towards a lower surface 2 that faces away from the upper surface 1 of the semiconductor chip 10. The depth D of the blind via 3 is less than the thickness T of the semiconductor chip 10.

After the blind vias 3 are defined, an insulation layer 8 is formed on the inner surfaces and the bottom surfaces of semiconductor chip 10 which are formed by defining the blind vias 3. The insulation layer 8 can comprise an organic layer or an inorganic layer. The insulation layer 8 electrically insulates the through-electrodes 20 from the respective semiconductor chip 10.

Afterwards, a metal seed layer is formed to cover the upper surface 1 of the semiconductor chip 10 and the side and bottom surfaces of the blind vias 3, and a plating process is conducted using the metal seed layer. As a result, a plated layer is formed on the side and bottom surfaces of the blind vias 3 and the upper surface 1 of the semiconductor chip 10. Then, by removing the plated layer which is formed on the upper surface 1 of the semiconductor chip 10, through-electrodes 20 can be formed within the blind vias 3.

Figure 5:
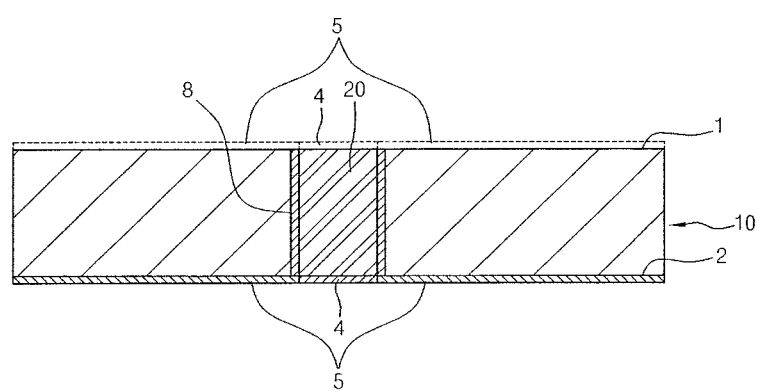

Referring to FIG. 5, the lower surface 2 of the semiconductor chip 10 is processed by using an etching process and/or a polishing process, by which the through-electrodes 20 are formed that pass through the upper surface 1 and the lower surface 2 of the semiconductor chip 10 so that both ends of the through-electrodes 20 are exposed outside of the semiconductor chip 10.

Next, a first polarized part 4 is formed on at least one end of both ends of each through-electrode 20, and a second polarized part 5 is formed on at least one of the upper surface 1 and the lower surface 2 of the semiconductor chip 10. In this illustrative embodiment, it is preferred that the first and second polarized parts 4 and 5 do not overlap with each other.

In this embodiment, the first polarized part 4, which covers at least one end of both ends of each through-electrode 20, can be non-polar containing a hydrophobic substance, and the second polarized part 5, which covers the upper surface 1 and/or the lower surface 2 of the semiconductor chip 10, can be polar containing a hydrophilic substance. Conversely, the first polarized part 4 can be polar containing a hydrophilic substance, and the second polarized part 5 can be non-polar containing a hydrophobic substance.

Figure 6:
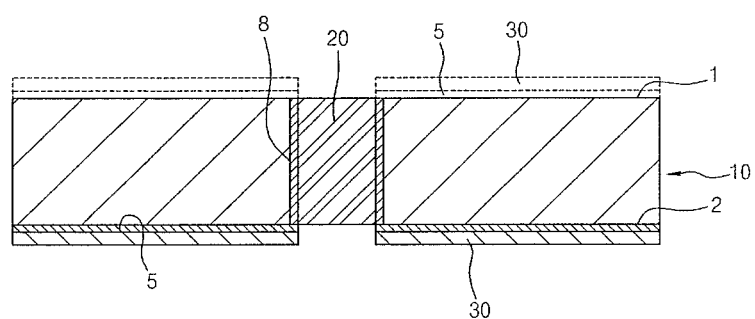

Referring to FIG. 6, subsequent to when the first and second polarized parts 4 and 5 are formed on the through-electrodes 20 and the semiconductor chip 10, a current leakage prevention layer 30 is formed that covers the upper surface 1 and/or the lower surface 2 of the semiconductor chip 10.

The current leakage prevention layer 30 contains an insulation substance that reacts with the second polarized part 5.

In the case where the second polarized part 5 which is formed on the upper surface 1 and/or the lower surface 2 of the semiconductor chip 10 is polar containing a hydrophilic substance, the current leakage prevention layer 30 is non-polar containing an insulation substance.

In the case where the second polarized part 5 which is formed on the upper surface 1 and/or the lower surface 2 of the semiconductor chip 10 is non-polar containing a hydrophobic substance, the current leakage prevention layer 30 contains an insulation substance.

After the current leakage prevention layer 30 is formed on the upper surface 1 and/or the lower surface 2 of the semiconductor chip 10, the first polarized part 4 is removed which was covered over the ends of the through-electrodes 20 so that the ends of the through-electrodes 20 are now exposed.

Figure 7:
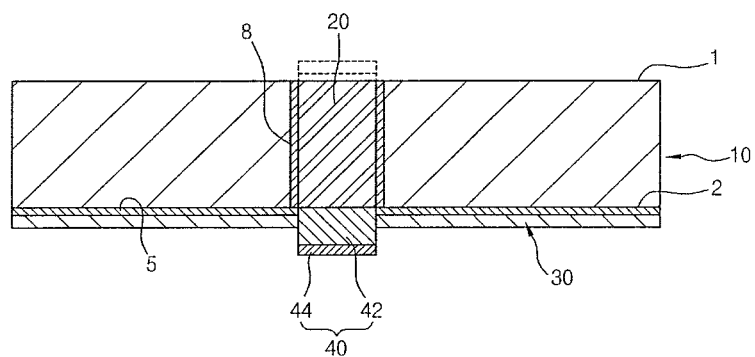

After the current leakage prevention layer 30 is formed on the upper surface 1 and/or the lower surface 2 of the semiconductor chip 10, connection members 40 are formed at the now exposed ends of the through-electrodes 20 as shown in FIG. 7.

The connection members 40 can be formed as a single-layered structure or as a multi-layered structure.

When the connection member 40 is formed as a single-layered structure, the connection member 40 can contain solder. Conversely, when the connection member 40 is formed as a multi-layered structure, then the connection member 40 can include a first connection member 42 disposed on the through-electrode 20 and a second connection member 44 disposed on the first connection member 42.

One embodiment is that the first connection member 42 can comprise a nickel layer and the second connection member 44 can comprise a gold layer. Another embodiment is that the first connection member 42 can comprise a copper layer and the second connection member 44 can comprise an alloy layer of tin and silver.

In other embodiments, the connection members 40 can have a length that projects outward away from the current leakage prevention layer 30.

After the connection members 40 are connected to the through-electrodes 20, as can be readily seen from FIG. 3, at least two semiconductor chips 10 are stacked together. Then, the stacked semiconductor chips 10 are electrically coupled together by using the connection members 40. Then the stacked semiconductor chips 10 along with the connection members 40 are then mounted onto a substrate 80 to form the manufactured semiconductor package.

As is apparent from the above description, the present invention provides advantages in that, a current leakage prevention layer is formed to prevent the occurrence of current leakage from a semiconductor package having through-electrodes and a number of processes for forming the current leakage prevention layer can be decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor package, the method comprising:
    forming through-electrodes that pass through a first surface and second surface, facing away from the first surface, of a semiconductor chip;
    forming polar parts onto ends of the through-electrodes that corresponds to at least one of the first surface and the second surface and forming non-polar parts onto the at least one of the first surface and the second surface excluding the polar parts;
    forming a current leakage prevention layer on the non-polar parts using a current leakage prevention substance; and
    forming connection members onto at least one end of the through-electrodes.

2. The method according to claim 1, wherein, before the step of forming the through-electrodes, the method further comprises the steps of:
    defining through-holes that pass through the first and second surfaces of the semiconductor chip; and
    forming an insulation layer onto inner surfaces of the semiconductor chip which are formed by the through-holes.

3. The method according to claim 2, wherein when forming the current leakage prevention layer, the current leakage prevention layer covers exposed ends of the insulation layer.

4. The method according to claim 1, wherein, before the step of forming the connection members, the method further comprises removing the polar parts from the ends of the through-electrodes.

5. The method according to claim 1, wherein the step of forming the connection members comprises the steps of:
    forming a nickel layer onto at least one ends of the through-electrodes; and
    forming a gold layer onto the nickel layer.

6. The method according to claim 1, wherein the step of forming the connection members comprises the steps of:
    forming a copper layer onto at least one ends of the through-electrodes; and
    forming an alloy layer of tin and silver onto the copper layer.

7. The method according to claim 1, wherein the polar parts contain a hydrophilic substance, and the non-polar parts contain a hydrophobic substance.

8. The method according to claim 1, wherein the polar parts contain a hydrophilic hydroxyl surface group (—OH).

9. The method according to claim 1, the method further comprises the step of forming additional polar parts onto the other ends of the through-electrodes that correspond to the first surface and forming additional non-polar parts onto the first surface excluding the additional polar parts.

10. A method for manufacturing a semiconductor package, the method comprising:
    forming through-electrodes that pass through a first surface and a second surface, facing away from the first surface, of a semiconductor chip;
    forming non-polar parts onto ends of the through-electrodes that corresponds to at least one of the first surface and the second surface and forming polar parts onto the at least one of the first surface and the second surface excluding the non-polar parts;
    forming a current leakage prevention layer on the polar parts using a current leakage prevention substance; and
    forming connection members onto at least one end of the through-electrodes.

11. The method according to claim 10, wherein, before the step of forming the through-electrodes, the method further comprises the steps of:
    defining through-holes that pass through the first and second surfaces of the semiconductor chip; and
    forming an insulation layer onto inner surfaces of the semiconductor chip which are formed by the through-holes.

12. The method according to claim 11, wherein when forming the current leakage prevention layer, the current leakage prevention layer covers exposed ends of the insulation layer.

13. The method according to claim 10, wherein, before the step of forming the connection members, the method further comprises removing the non-polar parts from the ends of the through-electrodes.

14. The method according to claim 10, wherein the step of forming the connection members comprises the steps of:
    forming a nickel layer onto at least one end of the through-electrodes; and
    forming a gold layer onto the nickel layer.

15. The method according to claim 10, wherein the step of forming the connection members comprises the steps of:
    forming a copper layer onto at least one end of the through-electrodes; and
    forming an alloy layer of tin and silver onto the copper layer.

16. The method according to claim 10, wherein the non-polar parts contain any a hydrophobic substance, and the polar parts contain a hydrophilic substance.

17. The method according to claim 10, wherein the polar parts contain a hydrophilic hydroxyl surface group (—OH).

18. The method according to claim 10, the method further comprises the step of forming additional non-polar parts onto the other ends of the through-electrodes that correspond to the first surface and forming additional polar parts onto the first surface excluding the additional non-polar parts.

* * * * *